United States Patent
Lee

(10) Patent No.: US 8,044,380 B2
(45) Date of Patent: Oct. 25, 2011

(54) NITRIDE SEMICONDUCTOR LIGHT EMITTING DEVICE AND FABRICATION METHOD THEREOF

(75) Inventor: Suk Hun Lee, Gwangsan-gu (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/722,670

(22) PCT Filed: Dec. 5, 2005

(86) PCT No.: PCT/KR2005/004122
§ 371 (c)(1),
(2), (4) Date: Jun. 22, 2007

(87) PCT Pub. No.: WO2006/068378
PCT Pub. Date: Jun. 29, 2006

(65) Prior Publication Data
US 2008/0135829 A1    Jun. 12, 2008

(30) Foreign Application Priority Data
Dec. 23, 2004 (KR) .......................... 10-2004-0111089

(51) Int. Cl.
*H01L 29/00* (2006.01)
(52) U.S. Cl. ............... 257/13; 257/E29.069; 257/14
(58) Field of Classification Search ............... 257/14, 257/E29.69
See application file for complete search history.

(56) References Cited

U.S. PATENT DOCUMENTS

| | | | |
|---|---|---|---|
| 2002/0158259 A1* | 10/2002 | Ono et al. | 257/79 |
| 2005/0250233 A1* | 11/2005 | Lee | 438/47 |
| 2006/0175621 A1* | 8/2006 | Ohtsuka et al. | 257/88 |

FOREIGN PATENT DOCUMENTS

| | | |
|---|---|---|
| EP | 1 221 723 | 7/2002 |
| JP | 2-203520 | 8/1990 |
| JP | 5-074705 | 3/1993 |
| JP | 5-347255 | 12/1993 |
| JP | 09-06396 A | 3/1997 |
| JP | 10-112438 | 4/1998 |
| JP | 10-112438 | * 10/1998 |
| KR | 10-2003-0092957 | * 12/2003 |
| KR | 10-2005-0061681 | 6/2005 |
| WO | WO 03/083950 | 10/2003 |
| WO | WO 2004/017431 | 2/2004 |

OTHER PUBLICATIONS

English's translation of JP10-112438.*
Office Action dated Jun. 6, 2008 in Chinese Application No. 200580041801.1, filed Dec. 5, 2005.
Office Action dated Jun. 28, 2011 in Japanese Application No. 2007-548059, filed Dec. 5, 2005.

* cited by examiner

*Primary Examiner* — Quoc Hoang
*Assistant Examiner* — Tony Tran
(74) *Attorney, Agent, or Firm* — Saliwanchik, Lloyd & Eisenschenk

(57) ABSTRACT

Provided is a nitride semiconductor light emitting device including: a first nitride semiconductor layer; an active layer formed above the first nitride semiconductor layer; and a "C (carbon)"-doped second nitride semiconductor layer formed above the active layer. According to the present invention, the crystallinity of the active layer is enhanced, and the optical power and the operation reliability are enhanced.

23 Claims, 2 Drawing Sheets

[FIGURE 1]
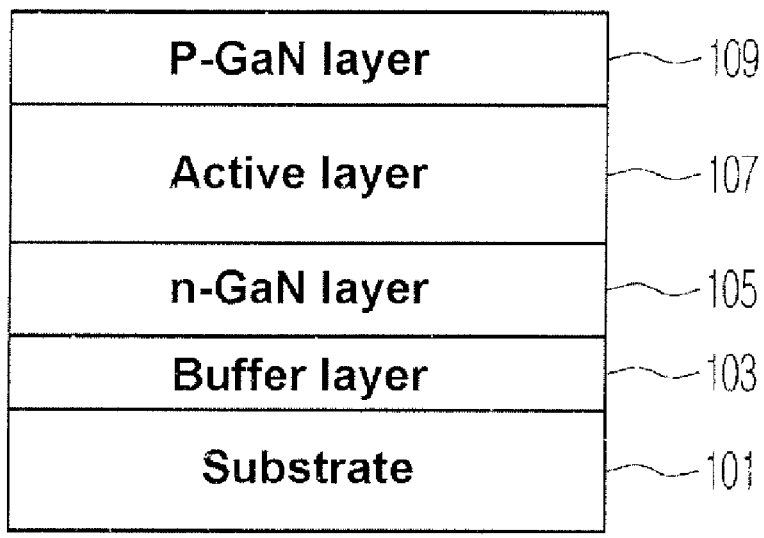
[FIGURE 2]
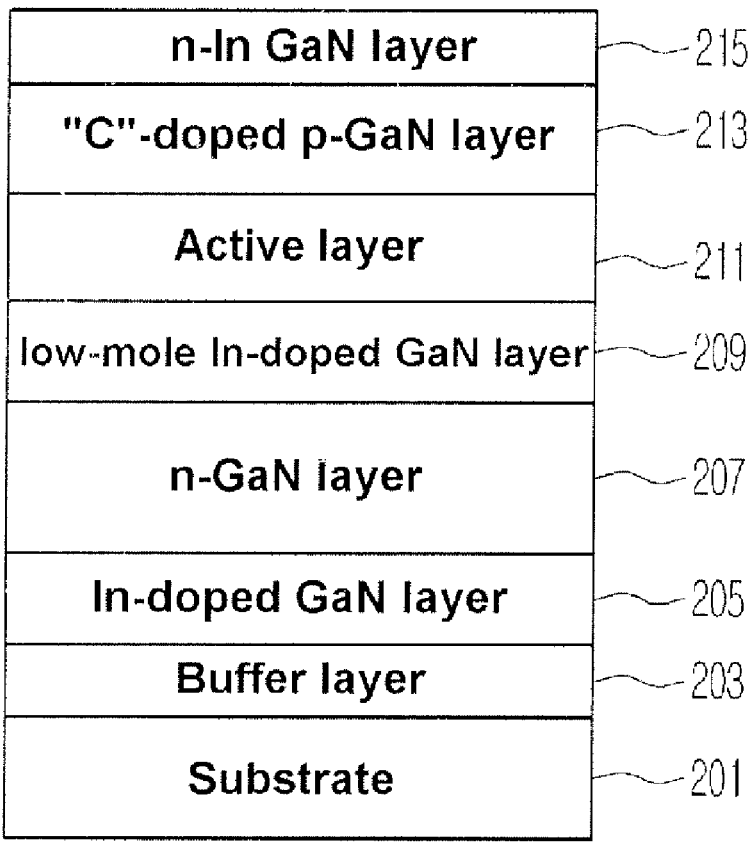

[FIGURE 3]
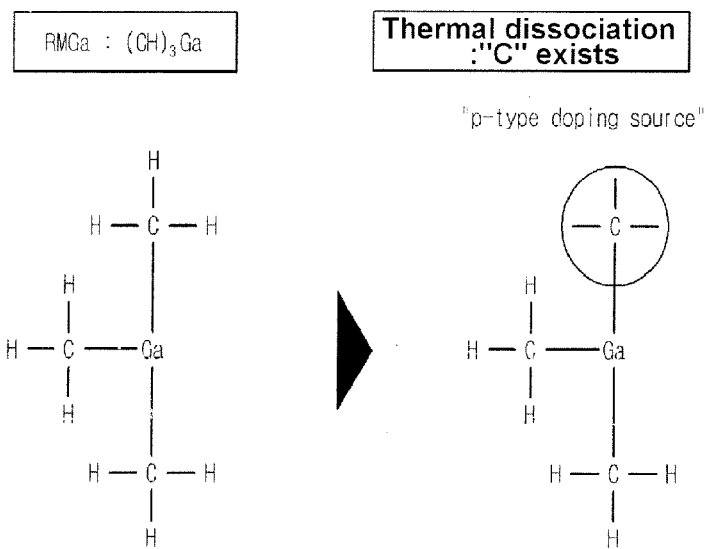
[FIGURE 4]
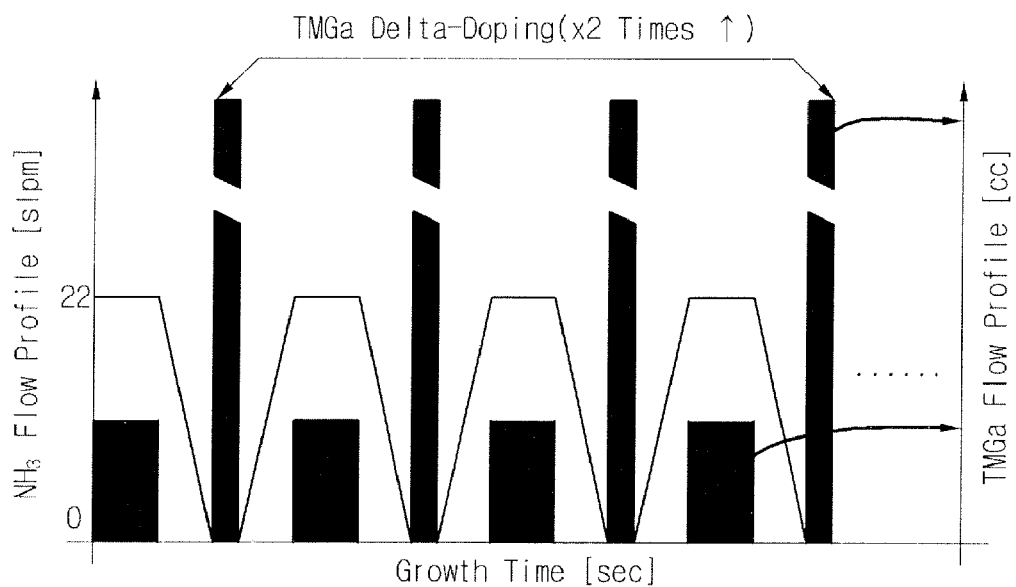

NITRIDE SEMICONDUCTOR LIGHT EMITTING DEVICE AND FABRICATION METHOD THEREOF

CROSS-REFERENCE TO RELATED APPLICATION

This application is the U.S. national stage application of International Patent Application No. PCT/KR2005/004122, filed Dec. 5, 2005, the disclosure of which is hereby incorporated by reference in its entirety.

TECHNICAL FIELD

The present invention is relative to a nitride semiconductor light emitting device and fabrication method thereof, and to a nitride semiconductor light emitting device of which light output and operation reliability are enhanced, and a fabrication method thereof.

BACKGROUND ART

A schematic stack structure of a general nitride semiconductor light emitting device and a fabrication method thereof will now be described.

A general nitride semiconductor light emitting device is provided in a stack structure including a substrate, a buffer layer, an n-GaN layer, an active layer and a pGaN layer sequentially stacked from a lower side.

In detail, in order to minimize the occurrence of crystal defects due to differences in the lattice constants and the thermal expansion coefficients of the substrate, for example, sapphire substrate, and the n-GaN layer, the buffer layer is formed of a GaN-based nitride or an AlN-based nitride having an amorphous phase at a low temperature. The n-GaN layer doped with silicon at a doping concentration of $10^{18}/cm^3$ is formed at a high temperature as a first electrode contact layer. Thereafter, the growth temperature is lowered and the active layer is formed. Thereafter, the growth temperature is again elevated and the p-GaN layer doped with magnesium (Mg) is formed.

The nitride semiconductor light emitting device having the aforementioned stack structure is formed in a p-/n-junction structure which uses the n-GaN layer as the first electrode contact layer and uses the p-GaN layer as the second electrode contact layer.

To form the p-GaN layer used as the second electrode contact layer, the p-/n-junction light emitting device using the nitride semiconductor employs a doping source of $Cp_2Mg$ or DMZn. In the case of DMZn, since Zn is in 'deep energy level' within the p-GaN layer and has a very high activation energy, the hole carrier concentration serving as a carrier when a bias is applied is limited to about $1\times10^{17}/cm^3$. Accordingly, $Cp_2Mg$ MO (metal organic) having a low activation energy is used as the doping source.

In case the Mg-doped p-GaN layer is grown using a doping source of $Cp_2Mg$, $NH_3$ carrier gas and hydrogen (H) gas separated from the doping source are combined to form an Mg-H complex, which shows a high resistance insulation characteristic of more than $\sim10^6\Omega$. Accordingly, in order to emit light during the recombination process of holes and electrons in the active layer, an activation process is essentially required to break the bond of Mg-H complex. Since the Mg-doped p-GaN layer has a high resistance, it can not be used without any change. The activation process is performed through an annealing process at an temperature range of 600~800° C. in an ambient of $N_2$, $N_2/O_2$. However, since Mg existing in the p-GaN layer has a low activation efficiency, it has a relatively high resistance value compared with the n-GaN layer used as the first electrode contact layer. In real circumstance, after the activation process, the atomic concentration of Mg in the p-GaN layer is in a range of $10^{19}/cm^3 \sim 10^{20}/cm^3$, and the hole carrier concentration contributing to a pure carrier conductivity is in a range of $10^{17}/cm^3 \sim 10^{18}/cm^3$, which correspond to a difference of maximum $10^3$ times. It is also reported that the hole mobility is $10\ cm^3$/vsec, which is a very low value. Due to the Mg atomic concentration remaining in the p-GaN layer without a complete activation, light emitting from the active layer toward the surface is trapped, or when a high current is applied, heat is generated due to a relatively high resistance value, so that the life time of the light emitting device is shortened to have a fatal influence on the reliability.

Especially, in the case of a large size/high power 1mm×1mm light emitting device using a flip chip technique, since a current of 350 mA which is very higher than a conventional current of 20 mA is applied, a junction temperature of more than 100° C. is generated at the p-/n-junction face, having a fatal influence on the device reliability and causing a limitation to product application in future. The generated much heat is caused by an increase of resistance component due to the Mg atomic concentration remaining in the p-GaN layer used as the second electrode contact layer without being activated as a carrier, and a rough surface property due to the increase of the resistance component.

Meanwhile, in the aforementioned p-/n-junction light emitting device, the n-GaN layer used as the first electrode contact layer can easily control the hole concentration within $5\sim6\times10^{18}/cm^3$ within a critical thickness ensuring the crystallinity in proportional to the silicon doping concentration depending on an increase in the flow rate of $SiH_4$ or $Si_2H_6$, whilst in the p-GaN layer used as the second electrode contact layer, the hole concentration substantially serving as carriers is limited within a range of $1\sim9\times10^{17}/cm^3$ although the flow rate of $Cp_{2Mg}$ is increased to dope Mg atoms of more than maximum $\sim10^{20}/cm^3$. To this end, the conventional light emitting device is made in a p-/n-junction structure having an asymmetric doping profile.

Thus, the low carrier concentration and high resistance component of the p-GaN layer used as the second electrode contact layer cause the light emitting efficiency to be decreased.

To solve the above problem, a conventional method of increasing the optical power by employing Ni/Au TM (transparent thin metal), having a good transmission and a good current spreading and a low contact resistance has been proposed, as a second electrode. However, the conventional method badly influences the device reliability when being applied to a large size/high power light emitting device. This problem still remains unsettled in the light emitting devices using the GaN semiconductor.

DISCLOSURE OF INVENTION

Technical Problem

To solve the above problems, the present invention provides a nitride semiconductor light emitting device and fabrication method thereof that can enhance the optical power and reliability.

Also, the present invention provides a nitride semiconductor light emitting device and fabrication method thereof that can solve a lowering of the optical power and an operation reliability problem due to the Mg-doped p-GaN.

Technical Solution

To accomplish the above objects, there is provided a nitride semiconductor light emitting device including: a first nitride semiconductor layer; an active layer formed above the first nitride semiconductor layer; and a "C (carbon)"-doped second nitride semiconductor layer formed above the active layer.

In another aspect of the present invention, there is provided a nitride semiconductor light emitting device including: a first nitride semiconductor layer used as a first electrode contact layer; an active layer formed above the first nitride semiconductor layer; a "C"-doped second nitride semiconductor layer formed above the active layer; and a third nitride semiconductor layer formed above the "C"-doped second nitride semiconductor layer and used as a second electrode contact layer.

In another aspect of the present invention, there is provided a method of fabricating a nitride semiconductor light emitting device, the method including: forming a first nitride semiconductor layer above a substrate; forming an active layer above the first nitride semiconductor layer; and forming a "C"-doped second nitride semiconductor layer above the active layer.

Advantageous Effects

According to the present invention, the crystallinity of the active layer of the nitride semiconductor light emitting device can be enhanced, and the optical power and reliability can be also enhanced.

Also, the characteristic of the p-GaN layer is improved to enhance the light emitting efficiency and reliability of the light emitting device.

BRIEF DESCRIPTION OF THE DRAWINGS

The spirit of the present invention will be understood more apparently from the accompanying drawings. In the drawings:

FIG. 1 is a sectional view of a nitride semiconductor light emitting device according to the present invention;

FIGS. 2 and 3 are schematic views showing bonding structures of TMGa thermally decomposed at a high growth temperature, and especially, FIG. 2 is a chemical formula of TMGa before the thermal dissociation and FIG. 3 is a chemical formula of TMGa after the thermal dissociation; and FIG. 4 is a view illustrating a delta-doped nitride semiconductor layer in a nitride semiconductor light emitting device according to the present invention.

BEST MODE FOR CARRYING OUT THE INVENTION

Hereinafter, an embodiment of the present invention will be described with reference to the accompanying drawings.

FIG. 1 is a sectional view of a nitride semiconductor light emitting device according to the present invention;

Referring to FIG. 1, the nitride semiconductor light emitting device according to the present invention includes a substrate 201, a buffer layer 203, an In-doped GaN layer 205, an n-GaN layer 207, a low-mole In-doped GaN layer or low-mole InGaN layer 209, an active layer 211, a "carbon (C)"-doped p-GaN layer 213, and an n-InGaN layer 215.

In the present invention, the buffer layer 203 is grown at a low growth temperature range of 500-600° C. on the substrate 201, for example, on a sapphire substrate. Herein, the buffer layer 203 can be formed in one selected from the group consisting of a stack structure of AlInN/GaN, a super lattice structure of InGaN/GaN, a stack structure of $InxGa1-xN/GaN$, and a stack structure of $AlxInYGa1-(x+Y)N/InxGa1-xN/GaN$.

Thereafter, the buffer layer 203 is recrystallized at a high growth temperature, and the In-doped GaN layer 205 is grown to a thickness of less than 2 μm under the same temperature condition. Thereafter, the n-GaN layer 207 used as a first electrode contact layer is grown to an overall thickness of less than 2 μm in an AlGaN/n-GaN super lattice layer.

The AlGaN/n-GaN super lattice layer is formed in a super lattice structure including the undoped AlGaN grown to a thickness of less than 100 Å with an Al composition of 20%, and the silicon (SO-doped n-GaN layer having a thickness of less than 300 Å. Also, the AlGaN/n-GaN super lattice layer has at least one period, one period consisting of the AlGaN layer and the n-GaN layer and formed at a thickness of less than 400 Å, and is formed at an overall thickness of less than 2 μm by repeatedly growing one period. Additionally, the AlGaN/n-GaN super lattice layer is formed such that the thickness of each of the AlGaN layer and the n-GaN layer is smaller than that of the buffer layer 203 formed at a relatively low temperature and only the n-GaN layer is doped with Si.

Further, to increase the internal quantum efficiency of the active layer 211, before the active layer is grown, the low-mole In-doped GaN layer or low-mole InGaN layer 209 as a strain control layer capable of controlling the strain of the active layer 211 is grown. The low-mole In-doped GaN layer or low-mole InGaN layer 209 is grown such that the doped indium content is less than 5%. Also, the low-mole In-doped GaN layer or low-mole InGaN layer 209 is grown such that its thickness is in a range of 100-300 Å.

As the active layer 211 emitting light having a desired wavelength band, a single quantum well or a multi quantum well having one period consisting of well layer/barrier layer is grown in $InxGa1-xN$ (15~35%)/an $InyGa1-yN$ (less than 5%) structure. Although not shown in the drawings, a SiNx cluster layer can be further formed between the well layer and the barrier layer at an atomic level to increase the light emitting efficiency of the active layer 211.

Thereafter, the growth temperature is increased to grow the "C"-doped p-GaN layer 213. The way of growing the "C"-doped p-GaN layer 213 is a feature of the present invention, which will be described in detail with reference FIGS. 2 and 3.

Thereafter, the n-InGaN layer 215 used as the second electrode contact layer is grown in a super grading structure in which the indium content is sequentially controlled.

Through the above fabrication process, the nitride semiconductor light emitting device of the present invention forms an n-/p-/n-junction structure. A second electrode material formed on the n-InGaN layer 215 is determined by a doping phase or an energy bandgap difference of the n-InGaN layer 215. Then, since to increase the current spreading effect, the n-InGaN layer 215 has the super grading structure in which the indium content is linearly varied to control energy bandgap, the second electrode material can be a transmissive oxide or a transmissive resistive metal. Examples of the second electrode material include ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, Ni/IrOx/Au/ITO and the like.

The light emitting device having the above construction can enhance the optical power 30~50% compared with the conventional light emitting device, and it can also enhance the operation reliability of the light emitting device.

Hereinafter, the process of growing the "C"-doped p-GaN layer 213 will be described with reference to FIGS. 2 to 4.

FIGS. 2 and 3 are schematic views showing bonding structures of TMGa thermally decomposed at a high growth temperature, and especially, FIG. 2 is a chemical formula of TMGa before the thermal dissociation and FIG. 3 is a chemical formula of TMGa after the thermal dissociation.

To grow the "C"-doped p-GaN layer 213, the present invention uses TMGa((CH)3 Ga) used to grow the GaN layer as a doping source instead of Cp2Mg or DMZn used as the p-type doping source. In detail, the "C" source generated during a thermal dissociation of TMGa((CH)3Ga) source at a high growth temperature is used as a doping source of the p-GaN layer to grow the "C"-doped p-GaN layer 213. In other words, as shown in FIG. 3, it can be seen that at a high growth temperature, "C" source is generated from a chemical formula obtained by a thermal dissociation of TMGa (trimethygallium) MO source. The generated "C" source is used as a doping source during the growth of the p-GaN layer. According to the present process, like in the conventional art, it is possible to control the surface roughness according to Mg or Zn doping, occurrence of a trap center is fundamentally prevented, and a relatively good quality of p-GaN layer can be provided. In FIG. 3, reference numeral 10 represents the "C" source.

To attain the present invention, the 'Ga-rich' technique which decreases more than 10 times V/III ratio including TMGa source and NH3 source gas used to grow the GaN layer is applied. This is because the TMGa source generates "C" component during its thermal dissociation at a high growth temperature of more than 1000° C. but NH3 gas introduced as N source is also cracked to generate residual hydrogen (H) gas and C—H recombination is progressed to form a byproduct. Therefore, it is possible to increase the "C" doping efficiency by sharply reducing the V/III ratio, i.e., NH3 source gas flow rate less than 10 times.

As aforementioned, the present invention employs the 'Ga-rich' growth technique so as to use the "C" in the TMGa MO source as a p-type doping source, which will be now described in more detail.

When the doping source, such as Cp2Mg or DMZn is generally used, NH3 source gas is introduced together with a carrier gas in which H2, N2, and H2/N2 are mixed. Since H2 gas and N2 gas serve as carriers and are not thermally dissociated at a high temperature of more than 1000° C., they are discharged without forming a byproduct. However, in the case of NH3 source gas, as the growth temperature increases, the cracking efficiency increases to generate much amount of hydrogen gas. Therefore, "C" dissociated from TMGa can be easily recombined into 'C—H'. Thus, thermally dissociated H gas serves as a main factor forming the conventional Mg—H complex or Zn—H complex. Therefore, in using the "C" as a doping source, the conventional method introducing a few liters to a few ten liters of doping source fails to obtain a desired doping efficiency. Accordingly, a V/III ratio control technique, which reduces the amount of NH3 source gas as much as possible, for example, more than at least two times and sharply increases the amount of TMGa source, and a delta doping technique which sharply increases the introducing amount of TMGa source more than two times greater than the conventional method for a few seconds to a few ten seconds are employed.

FIG. 4 is a view illustrating a delta-doped nitride semiconductor layer in a nitride semiconductor light emitting device according to the present invention.

As shown in FIG. 4, in the present invention, the dose of the TMGa source is adjusted to be periodically varied for forming p-GaN layer, and by doing so, the delta doping is performed.

According to the fabrication method of the nitride semiconductor light emitting device of the present invention, p-GaN layer is grown on the basis of undoped GaN layer by a new growth technique to form a good quality of p-GaN layer having a mirror face.

The "C"-doped p-GaN layer 213 is limited to an overall thickness range of 50~3000 Å and the delta doping time is preferably performed for 1~60 seconds.

Although the conventional Mg-doped p-GaN layer is activated, the Mg atomic concentration is within a range of $10^{19} \sim 10^{20}/cm^3$ but the pure hole carrier concentration contributing to the light emitting is $\sim 3 \times 10^{17}/cm^3$. Accordingly, excess Mg atoms of maximum $10^3/cm^3$ exist in the layer. These excess Mg atoms are diffused into Mg-H complex or the active layer, and serve as a resistance component and a carrier trap center, when a bias is applied, to lessen the internal quantum efficiency, so that the optical power is reduced. To solve the above problem, the present invention effectively suppresses the aforementioned problem to enhance the internal quantum efficiency and increase the optical power.

Hereinafter, an embodiment of the fabrication method of the nitride semiconductor light emitting device will be described in more detail.

First, in the present invention, only H2 carrier gas is supplied onto the sapphire substrate 201 at a high temperature to clean the sapphire substrate. Thereafter, in step of decreasing the growth temperature to 540° C., NH3 source gas is introduced to perform a nitridation of the sapphire substrate, for example for 10 minutes.

Thereafter, the buffer layer 203 having a $1^{st}$ AlInN/$1^{st}$ GaN/$2_{nd}$ AlInN/$2_{nd}$ GaN structure is grown to a thickness of about 500 Å. Then, the growth temperature is increased up to 1060° C. for 6minutes, the low temperature buffer layer 203 is recrystallized in a mixture ambient of $NH_3$ source gas and $H_2$ carrier gas for 2 minutes, and at the same growth temperature, the indium-doped single crystal GaN layer 205 having about 2 μm thickness is grown.

Thereafter, the growth temperature is decreased to 1030° C., and undoped AlGaN layer having an Al composition of 10% and Si-heavily doped n-GaN layer are respectively grown to thicknesses of 50 Å and 250 Å. At this time, the Al content can be in a range of 0.05~0.3 (1corresponds to 100%). The undoped AlGaN layer and the Si-heavily doped n-GaN layer can be formed in a thickness range of 10~200 Å. Thus, the AlGaN/n-GaN super lattice structure in which one period is formed at a thickness of 300 Å includes 40 periods, and the AlGaN/n-GaN super lattice layer thereof is grown to an overall thickness of 1 μm and is used as the first electrode contact layer 207. At this time, the Si doping concentration of the n-GaN layer can be in a range of $1 \sim 9 \times 10^{18}/cm^3$.

It is reported that the hole mobility and concentration of the first electrode contact layer having the AlGaN/n-GaN super lattice structure are respectively $450 cm^3/Vsec$ and $2 \times 10^{18}/cm^3$, which are 1.5~2 times higher than the existing n-GaN layer having the same thickness and Si doping concentration.

Also, to adjust the strain of the active layer, the low-mole In-doped GaN layer or low-mole InGaN layer 209 having 5% indium content (wavelength: 480 nm) is grown to a thickness of 300 Å at 750° C. The low-mole In-doped GaN layer or low-mole InGaN layer 209 is intentionally controlled in 'spiral growth mode' having a uniform profile on the 2 inch sapphire substrate. Thereafter, at the same growth temperature, the active layer 211 having a single quantum well (SQW) of InGaN/InGaN structure undoped with silicon is grown. In the active layer 211, the barrier layer has an indium content of less than 5% and a thickness of about 200 Å.

Thereafter, the growth temperature is increased to 1000° C. to grow the "C"-doped p-GaN layer 213 having a thickness of 0.1 μm. The "C"-doped p-GaN layer is grown by a delta doping in which an undoped GaN layer is grown in a thickness range of 50-100 Å so as to protect a rough surface of the initial active layer and the V/III ratio is decreased more than 10 times than the conventional growth method so as to suppress the occurrence amount of hydrogen (H radical) dissociated from $NH_3$ source gas at a high temperature to introduce TMGa MO source more than two times in a pulse form. At this time, the dose of $H_2$ carrier gas is the same. With one period of the undoped GaN layer and the doped GaN layer through TMGa pulse introduction, the "C"-doped p-GaN layer 213 is grown to an overall thickness of 0.1 μm.

Thereafter, the growth temperature is again decreased to 800° C., and in a mixture gas ambient of NH3 source gas and N2 carrier gas, the Si-doped n-InGaN layer 215 is grown to a thickness of 50 Å. The n-InGaN layer 215 is used as the second electrode contact layer and is designed to have a super grading structure in which the indium content is controlled to thereby control the energy bandgap (Eg) profile on the whole. The light emitting device thus formed has a general npn junction structure.

Meanwhile, unlike the conventional growth method using "C" MO source of GaAs, InAlGaAs, InGaP III-V compound semiconductor, the p-GaN layer growth method of the present invention is a growth method using "C" contained in TMGa MO source. This crystal growth method can substantially solve the following problems of the conventional growth method: when Cp2Mg MO source is used as a doping source of GaN layer, a rough surface is formed; a hole carrier concentration serving as a pure carrier is low; a trap center trapping light emitting from the active layer due to Mg or Mg—H complex remaining in the GaN layer without being activated is created; and a high resistance component exists.

MODE FOR THE INVENTION

As another embodiment included in the spirit of the present invention, the following method is also possible.

First, in the growth process of the p-GaN layer 213, dimethylhydrazine(UDMHy) MO source in which "N" is made from MO source is employed instead of the conventional method in which NH3 source gas is introduced to form "N" source, thereby effectively controlling the V/III ratio.

Also, a Si—In co-doped n-GaN layer having a thickness range of 1~4 μm can be employed as the first electrode contact layer 207.

Additionally, while the present embodiment proposes the light emitting device having the npn-SG structure, the "C"-doped p-GaN layer can directly serve as the second electrode contact layer and therefore the nitride semiconductor light emitting device of the present invention can be also used as a general np junction nitride semi-conductor light emitting device.

INDUSTRIAL APPLICABILITY

According to the nitride semiconductor light emitting device and fabrication method thereof provided in the present invention, the crystallinity of the active layer constituting the nitride semiconductor light emitting device can be enhanced and the optical power and reliability can be also enhanced.

Also, the present invention significantly solves the growth method of the p-GaN layer, and it can fundamentally solve the lowering problem of the optical power due to a high resistance component caused by Mg or Mg—H complex remaining on a rough surface of the existing Mg-doped GaN layer and in the Mg-doped GaN layer without being activated.

Additionally, "C" in TMGa MO source introduced to grow a nitride semiconductor compound is used as a doping source and undoped—GaN growth method having a very low surface roughness, a mirror face and a high quality crystallinity is still used to prevent the optical power down phenomenon occurring in a boundary between the active layer and the p-GaN layer.

Further, since the delta doping growth technique that can introduce the TMGa source gas instantaneously more than two times is applied, H radicals generated by a thermal dissociation of NH3 gas at a high temperature during the growth process of the "C"-doped p-GaN can be effectively suppressed.

The invention claimed is:

1. A nitride semiconductor light emitting device comprising:
   a first nitride semiconductor layer;
   an active layer formed above the first nitride semiconductor layer; and
   a "C (carbon)"-doped second nitride semiconductor layer formed above the active layer,
   wherein the "C"-doped second nitride semiconductor layer comprises an undoped GaN layer directly contacted with the active layer;
   a "C"-doped p-GaN layer on the undoped GaN layer;
   wherein the first nitride semiconductor layer is formed in a super lattice structure of AlGaN/n-GaN or in an n-GaN layer doped with Si and In, and fomed having at least one period; and
   wherein the first nitride semiconductor layer is formed in the super lattice structure of AlGaN/n-GaN, wherein the super lattice structure of AlGaN/n-GaN has one periodic thickness range of 250~500 Å.

2. The nitride semiconductor light emitting device according to claim 1, wherein the first nitride semiconductor layer is a first electrode contact layer.

3. The nitride semiconductor light emitting device according to claim 1, wherein the "C"-doped second nitride semiconductor layer is a second electrode contact layer.

4. The nitride semiconductor light emitting device according to claim 1, further comprising:
   a substrate;
   a buffer layer formed above the substrate; and
   an indium-doped nitride semiconductor layer formed above the buffer layer,
   wherein the substrate, the buffer layer and the indium-doped nitride semiconductor layer are sequentially formed below the first nitride semiconductor layer.

5. The nitride semiconductor light emitting device according to claim 1, wherein the first nitride semiconductor layer is formed in the super lattice structure of AlGaN/n-GaN, wherein the AlGaN layer is an undoped layer and is formed in a thickness range of 10~200 Å with an Al composition of 5-30%.

6. The nitride semi conductor light emitting device according to claim 1, wherein the n-GaN layer doped with Si and In has a doping concentration range of $1~9 \times 10^{18} cm^3$ and a thickness range of 1~4μm.

7. The nitride semiconductor light emitting device according to claim 1, wherein the "C"-doped p-GaN layer is formed by a delta doping where a TMGa MO source dose is varied, one pair of the undoped GaN layer and the "C"-doped p-GaN layer forming one period, wherein the "C"-doped second nitride layer is repeatedly grown in at least one period.

8. The nitride semiconductor light emitting device according to claim 7, wherein the TMGa MO source dose is increased at least twice when the "C"-doped p-GaN layer is grown.

9. The nitride semiconductor light emitting device according to claim 7, wherein the delta doping comprises the varied dose of TMGa MO source and $NH_3$.

10. The nitride semiconductor light emitting device according to claim 9, wherein when the TMGa MO source is introduced, the $NH_3$ is introduced such that as the "C"-doped p-GaN layer is grown, the introducing amount of the $NH_3$ is decreased more than two times.

11. The nitride semiconductor light emitting device according to claim 1, wherein the "C"-doped p-GaN layer is grown through a delta doping in which the dose of a TMGa MO source is varied.

12. The nitride semiconductor light emitting device according to claim 1, wherein carbon doped into the "C"-doped second nitride semiconductor layer is generated by a thermal dissociation of a TMGa MO source.

13. The nitride semiconductor light emitting device according to claim 1, wherein the "C"-doped second nitride semiconductor layer has an overall thickness range of 50~3,000Å.

14. The nitride semiconductor light emitting device according to claim 1, further comprising a low mole nitride semiconductor layer formed between the first nitride semiconductor layer and the active layer and having an indium content of 1~5%.

15. The nitride semiconductor light emitting device according to claim 1, wherein the active layer is formed in a single quantum well layer or a multi quantum well layer comprising a well layer and a barrier layer, wherein a SiNx cluster layer is formed between the well layer and the barrier layer.

16. The nitride semiconductor light emitting device according to claim 1, further comprising a third nitride semiconductor layer formed above the "C"-doped second nitride semiconductor layer and serving as a second electrode contact layer.

17. The nitride semiconductor light emitting device according to claim 16, wherein the third nitride semiconductor layer is formed of an n-InGaN layer with a super grading structure in which indium content is gradually varied.

18. The nitride semiconductor light emitting device according to claim 16, further comprising a transparent electrode formed above the third nitride semiconductor layer.

19. The nitride semiconductor light emitting device according to claim 18, wherein the transparent electrode is formed of one selected from the group consisting of ITO, IZO(In—ZnO), GZO(Ga—ZnO), AZO(Al—ZnO), AGZO (Al—Ga ZnO), IGZO(In—Ga ZnO), $IrO_x$, $RuO_x$, $RuO_x$/ITO, Ni/$IrO_x$/Au, and Ni/$IrO_x$/Au/ITO.

20. A nitride semiconductor light emitting device comprising:
   a first nitride semiconductor layer used as a first electrode contact layer;
   an active layer formed above the first nitride semiconductor layer;
   a "C"-doped second nitride semiconductor layer formed above the active layer, wherein the "C"-doped second nitride semiconductor layer comprises an undoped GaN layer directly contacted with the active layer and a "C"-doped p-GaN layer on the undoped GaN layer;
   an n-type third nitride semiconductor layer formed above the "C"-doped second nitride semiconductor layer and used as a second electrode contact layer;
   wherein the "C"-doped p-GaN layer is formed by a delta doping where a TMGa MO source dose is varied;
   wherein the TMGa MO source dose is increased at least twice when the "C"-doped p-GaN layer is grown.

21. The nitride semiconductor light emitting device according to claim 20, wherein the delta doping comprises the varied dose of TMGa MO source and NH3.

22. The nitride semiconductor light emitting device according to claim 20, wherein carbon doped into the "C"-doped second nitride semiconductor layer is generated by a thermal dissociation of a TMGa MO source.

23. The nitride semiconductor light emitting device according to claim 20, wherein the "C"-doped second nitride semiconductor layer has an overall thickness range of 50~3,000Å.

* * * * *